United States Patent
Kim

(10) Patent No.: US 7,589,581 B2
(45) Date of Patent: Sep. 15, 2009

(54) CIRCUIT FOR ADJUSTING REFERENCE VOLTAGE USING FUSE TRIMMING

(75) Inventor: Uladzimir Kim, Minsk (BY)

(73) Assignee: Neotec Semiconductor Ltd., Hsinchu Hsien (TW)

( * ) Notice: Subject to any disclaimer, the term of this patent is extended or adjusted under 35 U.S.C. 154(b) by 0 days.

(21) Appl. No.: 11/740,902

(22) Filed: Apr. 26, 2007

(65) Prior Publication Data

US 2008/0218248 A1    Sep. 11, 2008

(30) Foreign Application Priority Data

Mar. 6, 2007    (TW) ............... 96107703 A

(51) Int. Cl.
H01H 37/76    (2006.01)
H01H 85/00    (2006.01)

(52) U.S. Cl. ...................... 327/525; 327/526
(58) Field of Classification Search ................. 327/525, 327/526; 365/225.7

See application file for complete search history.

(56) References Cited

U.S. PATENT DOCUMENTS 5,150,216 A * 9/1992 Tokitou et al. .............. 348/299
6,359,428 B1 * 3/2002 Kawamura .................. 323/369

* cited by examiner

*Primary Examiner*—Lincoln Donovan
*Assistant Examiner*—John W Poos
(74) *Attorney, Agent, or Firm*—CKC & Partners Co., Ltd.

(57) ABSTRACT

A binary bidirectional trimming circuit is disclosed. The trimming circuit includes: a first resistor set having 4 resistors in parallel connected and a first fuse bridged two ends thereto provide one trimming step; a second resistor set having 2 resistors in series connected and a second fuse bridged two ends thereto provide eight trimming steps; a third resistor set having 2 resistors in parallel connected and a third fuse bridged two ends thereto provide two trimming steps; a fourth resistor set having 1 resistor and a fourth fuse bridged two ends thereto provide four trimming steps; a first loading resistor; and a second loading resistor. The first resistor set, second resistor set, first loading resistor, third resistor set, the fourth resistor set, and the second loading resistor are in series connected. The output terminal is located at the nodes of the third resistor set and the first loading resistor so that the trimming steps provided by the third resistor set and the fourth resistor set are opposite to that of the first resistor set and the second resistor set.

2 Claims, 3 Drawing Sheets

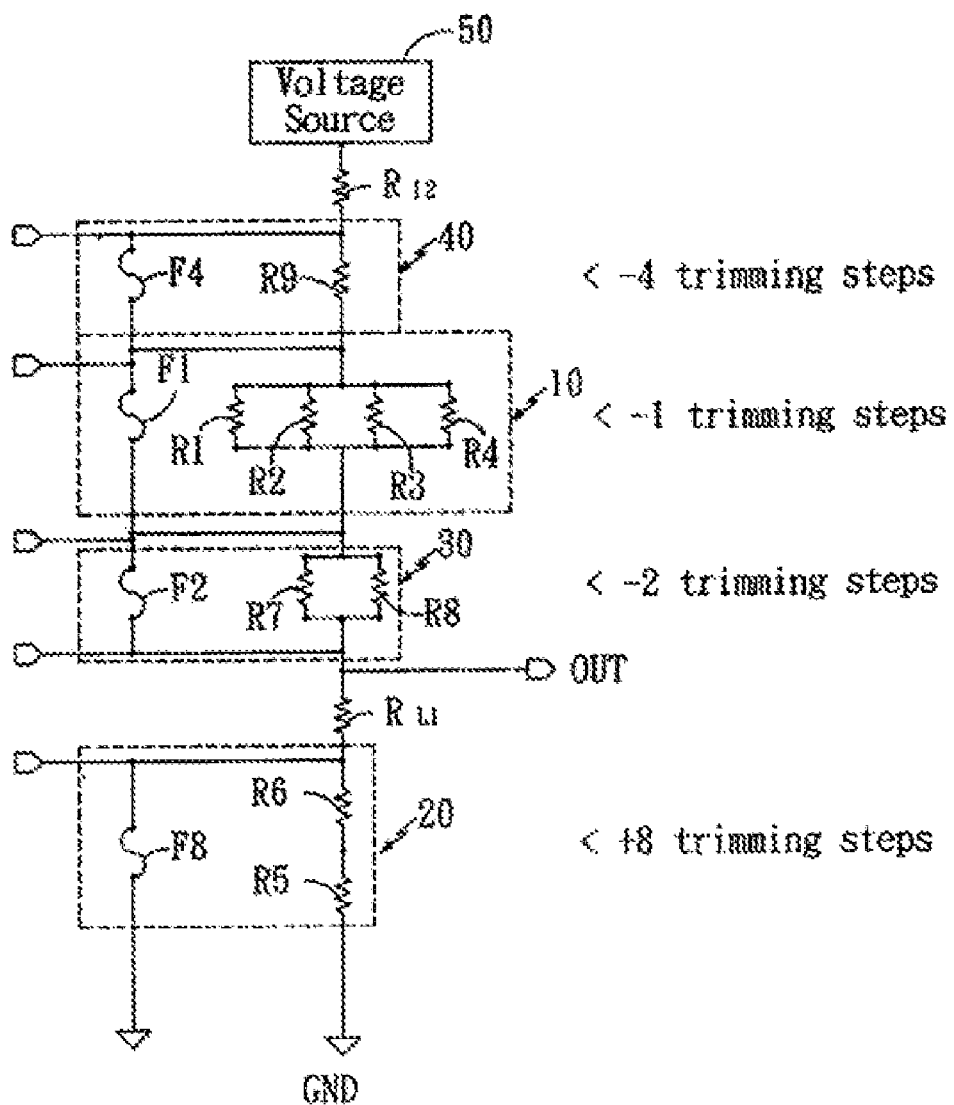
F I G . 3

CIRCUIT FOR ADJUSTING REFERENCE VOLTAGE USING FUSE TRIMMING

BACKGROUND OF THE INVENTION (1) Field of the Invention

The invention relates to a trimming fuse circuit, and more particularly, to a circuit.

(2) Description of the Prior Art

Recently, with advance of photolithography technology and etching technology in semiconductor industry, the integrity density of single chip is almost three orders of magnitude than ten years ago. In achievement of such a highly integrated circuit, the advance of semiconductor processes make a great contribution that is second to none, and memory cell repair concept as well as trimming fuse circuit also make a great contribution. During each of semiconductor process, dies on wafer must be precisely processed and precisely controlled, which is a high technology. But even in deep sub-micron era, and even in nanometer era, active elements like MOS, bipolar transistors etc, and passive elements, like resistors, capacitors etc, have some mismatches, which cause yield losses. The one reason is that when elements are miniature, the control of doping impurity concentration is very sensitive to doping and anneal condition.

Therefore, in order to increase yield, adjusting the resistance of the circuit by using a trimming fuse circuit is important while the electrical performance of die is lower than expected but within a tolerable condition after testing. Generally, the trimming fuse circuit that includes a plurality of fuses, a few control signals, and several resistors that are connected in series, is to adjust an optimum or a desired current path. Once an electrical performance result is satisfied after testing, then the desired current path is saved, and the redundant fuses are burnt-out by high current or by laser, which are guided by pre-determined control signals.

Especially, the battery protection ICs is found to require reference voltages with high accuracy (+/−0.5%). It's very difficult to get reference voltage with high accuracy with high yield rate due to process deviation during IC fabrication. One of the methods to do this adjustment and to reduce the number of fuses the binary search approach is usually used.

Regarding the trimming circuit in the prior art, please refer to FIG. 1, presenting the simplified circuit of prior art. In FIG. 1, the circuit is composed of fuses F1, F2, F4, and F8, and several resistors. All the resistors are with the same resistance R permuted by forms of in series and parallel to form 16 ways of combination. The fuses F1, F2, F4, and F8 are interposed in between the nodes GND-A, A-B, B-C, and C-D. Between the nodes GND-A, four resistors are in parallel, and thus if the fuse F1 is burned, the resistance of the output terminal OUT will be increased by ¼ R. Between the nodes A-B, two resistors are in parallel, and thus if the fuse F2 is burned, the resistance of the output terminal OUT will be increased by ½ R. Between the nodes B-C, single resistor is placed, and thus if the fuse F4 is burned, the resistance of the output terminal OUT will be increased by R. Between the nodes C-D, two resistors are in series, and thus if the fuse F8 is burned, the resistance of the output terminal OUT will be increased by 2R.

Accordingly, as the fuses F1, F2, F4, and F8 shorts, it will correspond to 1, 2, 4, and 8 unit resistors, respectively. Each unit resistors defines 1 trimming step. Using a big current through a fuse or using laser, or using other methods to burn the fuse(s) can thus achieve the aims of adjusting the reference voltage. By this approach, the designed reference voltage is aimed at the value lower than the target value and then is adjusted.

Worth to note the trimming steps are always positive. The possible permutation of trimming steps and the corresponding combinations of the fuses burned are shown in table 1.

TABLE 1

| Burning Fuses | F1 | F2 | F1, F2 | F4 | F1, F4 | F2, F4 | F1, F2, F4 | F8 | F1, F8 | F2, F8 | F1, F2, F8 | F4, F8 | F1, F4, F8 | F2, F4, F8 | F1, F2, F4, F8 |
|---|---|---|---|---|---|---|---|---|---|---|---|---|---|---|---|
| Trimming Steps | +1 | +2 | +3 | +4 | +5 | +6 | +7 | +8 | +9 | +10 | +11 | +12 | +13 | +14 | +15 |

Accordingly, the circuit shown in FIG. 1 provides only one direction trimming procedure, i.e., the trimming steps are always positive or only negative, as is shown in the Table 1. The relation of numbers of trimming steps with the fuses is like a binary code. That is the F1, F2, F4, and F8, respectively, as the lowest bit, second bit, third bit and the highest bit. For instance, the 11 trimming steps are correspondent to burning of F1, F2, and F8. total number of trimming steps=1+2+8.

Consequently, all fuses may need to be burned to meet the spec. however, the burning fuse procedure doesn't have 100% yield. It may sometimes damages internal circuit Besides, fuse burning procedures increase chip testing time.

In really, every adjusting parameter, for example, the battery protection IC the Over-Charge threshold voltage has however a minimum and maximum spec value (for example, 4.3V+/−25 mV), And modern IC fabrication processes have less variations than previous one. So, if our designed reference voltage is aimed at the typical spec value, we can avoid some burning of fuses

SUMMARY OF THE INVENTION

The present invention provides a binary bidirectional trimming fuse circuit. According to the present invention the binary bidirectional trimming fuse circuit includes: a first resistor set having 4 resistors in parallel connected and a first fuse bridged two ends thereto provide one trimming step; a second resistor set having 2 resistors in series connected and a second fuse bridged two ends thereto provide eight trimming steps; a third resistor set having 2 resistors in parallel connected and a third fuse bridged two ends thereto provide two trimming steps; a fourth resistor set having 1 resistor and a fourth fuse bridged two ends thereto provide four trimming steps; a first loading resistor; and a second loading resistor.

According to a first preferred embodiment, the first resistor set, second resistor set, first loading resistor, third resistor set, the fourth resistor set, and the second loading resistor are in series connected. The output terminal is located at the nodes of the third resistor set and the first loading resistor so that the trimming steps provided by the third resistor set and the fourth resistor set are opposite to that of the first resistor set and the second resistor set.

in the second preferred embodiment, the second resistor set, first loading resistor, third resistor set, first resistor set, the fourth resistor set, and the second loading resistor are in series connected. The output terminal is located at be nodes of the third resistor set and the first loading resistor so that the trimming steps provided by the first resistor set, the third resistor set and the fourth resistor set are opposite to that of the second resistor set

BRIEF DESCRIPTION OF THE DRAWINGS

The present invention will now be specified with reference to its preferred embodiment illustrated in the drawings, in which:

FIG. 3 shows a binary bidirectional trimming fuse circuit in accordance with a second preferred embodiment of the present invention.

DESCRIPTION OF THE PREFERRED EMBODIMENTS

Figure 1:
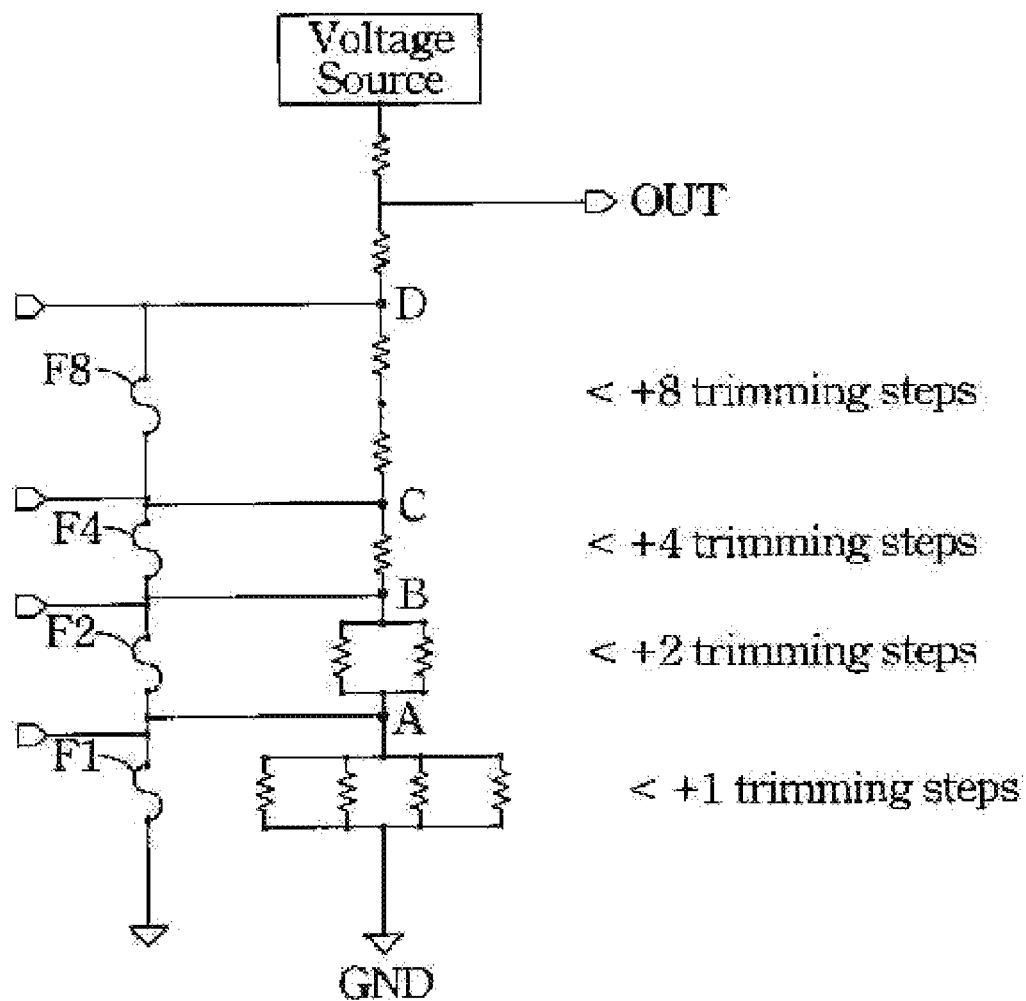
FIG. 1 shows a binary mono-directional trimming fuse circuit in accordance with prior art.

The binary trimming circuit shown in FIG. 1 provides user one directional adjustment only. This is because the number of trimming steps increase from the ground reference up to the output terminal by a way of $2^n$, where n is 0, 1, 2 and 3. The output terminal OUT is at the position over the most significant bit. Sometimes, a bidirectional trimming is often preferred to save the testing time. Accordingly, the present invention thus provide another approach, a binary bidirectional trimming circuit to resolve the issues of the prior art.

Figure 2:
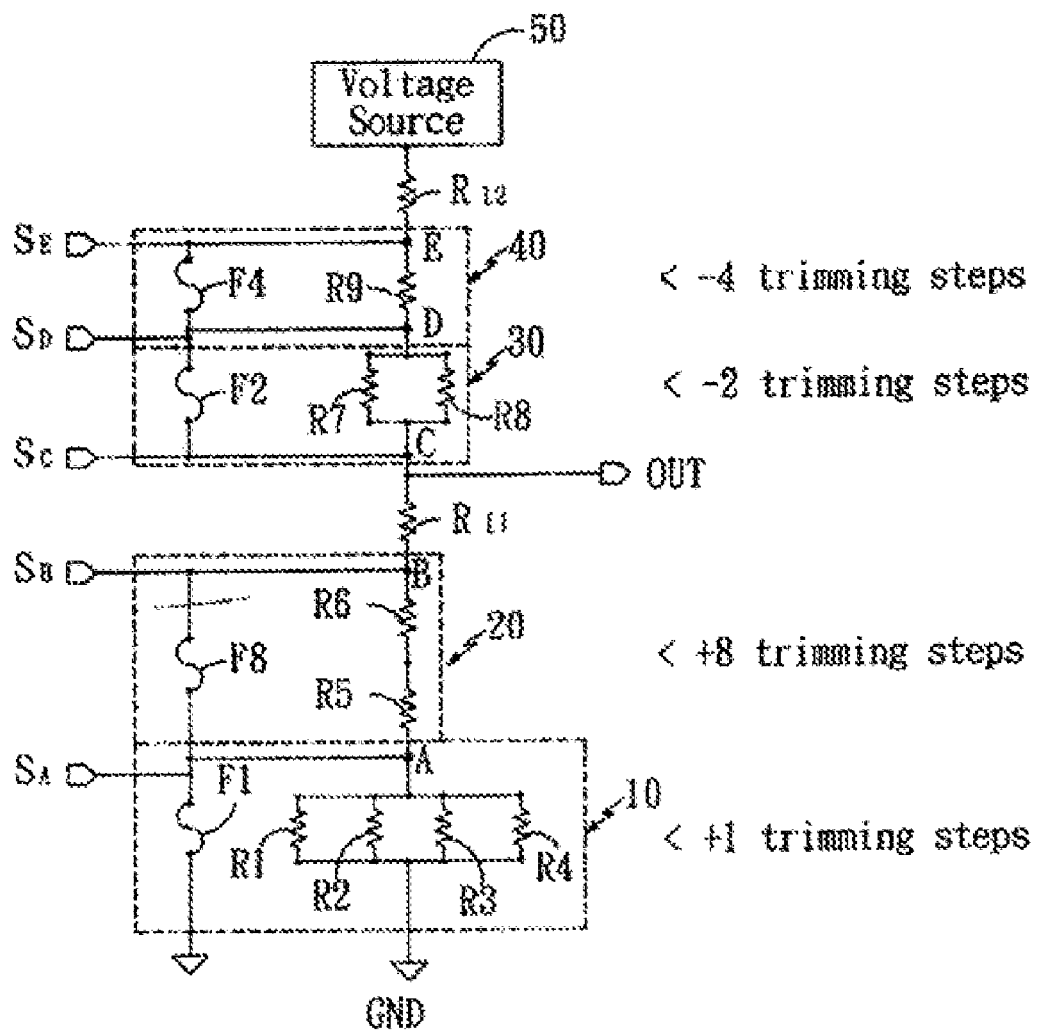
FIG. 2 shows a binary bidirectional trimming fuse circuit in accordance with a first preferred embodiment of the present invention.

Referring to FIG. 2, the total number of the resistors are the same as shown in FIG. 1, the permutation of the nodes, and the output terminal OUT are, however, changed. The binary bidirectional trimming circuit is composed of four resistor sets 10, 20, 30, 40 and two loading resistors $R_{L1}$, $R_{L2}$, as is shown in FIG. 2. There are: (1) a first resistor set 10 having 4 resistors R1, R2, R3, R4 in parallel connected and a first fuse F1 bridged two ends thereto provide one trimming step; (2) a second resistor set 20 having 2 resistors R5, R6 in series connected and a second fuse F8 bridged two ends thereto provide eight trimming steps; (3) a third resistor set 30 having 2 resistors R7, R8 in parallel connected and a third fuse F2 bridged two ends thereto provide two trimming steps; (4) a fourth resistor set 40 having 1 resistor R9 and a fourth fuse F4 bridged two ends thereto provide four trimming steps; (5) a first loading resistor RL1; (6) a second loading resistor $R_{L2}$; and (7) a voltage source 50, wherein the existence of the first loading resistor $R_{L1}$ and the second loading resistor $R_{L2}$ are optional. But it prefer to have at least one loading resistor so as to prevent the power source from shorting directly to the ground before one of the fuses is burned.

Still referring to FIG. 2, it shows the four resistor sets 10, 20, 30, 40 and two loading resistors $R_{L1}$, $R_{L2}$ are connected in series from the ground (GND) thereof with the following order: GND, the first resistor set 10, the second resistor set 20, the first resistor RL1, the third resistor set 30, the fourth resistor set 40, the second loading resistor $R_{L2}$, and the voltage source 50.

The output terminal OUT is at a connected node of the third resistor set 30 and the first resistor $R_{L1}$. Therefore, the output terminal OUT is under the third resistor set 30 and the fourth resistor set 40 but above the first resistor set 10, and the second resistor set 20. Since the former two 30, 40 are above the output terminal OUT, thus the effects of them 30, 40 are equivalent to negative trimming steps and is opposite the effects of the latter two 10, 20 which are positive trimming steps.

Consequently, the possible permutation of four types of trimming steps: −4, −2, +8, and +1 can be obtained by simple arithmetic: adding, subtracting and both. The results are shown in Tab 2.

TABLE 2

| Burning Fuses | Positive fuses (F1, F8) | F1 | F8 | F1, F8 | F8 | F1, F8 | F8 | F1, F8 | F8 | F1, F8 | F1 | X | F1 | X | F1 | X |
|---|---|---|---|---|---|---|---|---|---|---|---|---|---|---|---|---|
| | negative fuses (F2, F4) | X | F2, F4 | F2, F4 | F4 | F4 | F2 | F2 | X | X | F2 | F2 | F4 | F4 | F2, F4 | F2, F4 |
| Trimming Steps | | +1 | +2 | +3 | +4 | +5 | +6 | +7 | +8 | +9 | −1 | −2 | −3 | −4 | −5 | −6 |

Where "X" represent none.

Thus the binary trimming circuit provided is bidirectional though the circuit is asymmetry in "positive" and "negative" trimming direction. We can adjust the reference point with "positive" and "negative" trimming steps. To burn out a predetermined fuse(s), the control signals $S_A$, $S_B$, $S_C$, $S_D$, and $S_E$, as shown in FIG. 2, can be used to approach such aim.

The aforementioned embodiment is for illustrating convenience only but not intended to limit the claimed scopes. For instance, the binary bidirectional trimming circuit will not change its positive trimming steps and negative trimming steps even the position of the fourth resistor set 40 is swapped with the third resistor set 30 or the position of the first resistor set 10, second resistor set 20, and the first loading resistor $R_{L1}$ are in series connected with any arbitrary order.

The position of the output terminal OUT of the binary bidirectional trimming circuit can also be modified so that the numbers of positive trimming steps more symmetry to the numbers of the negative trimming steps FIG 3 shows such a scheme Referring to FIG 3, it shows the four resistor sets 10, 20, 30, 40 and. two loading resistors $R_{L1}$, $R_{L2}$ are connected in series horn the ground (GND) thereof with the following order: GND, the second resistor set 20, the first loading resistor RL1, the third resistor set 30, the first resistor set 10, the fourth resistor set 40, the second loading resistor $R_{L2}$ anti the voltage source 50 The output terminal OUT is at the connecting node of the third resistor set 30 and the fist loading resistor $R_{L1}$ The possible permutation of four types of trimming steps: −4, −2, −1, and +8 can be obtained by simple arithmetic: adding, subtracting and both. The results are shown in Tab 3.

TABLE 3

| Burning Fuses | Positive fuses (F8) | F8 | F8 | F8 | F8 | F8 | F8 | F8 | F8 | X | X | X | X | X | X | X |
|---|---|---|---|---|---|---|---|---|---|---|---|---|---|---|---|---|
| | negative fuses (F1, F2, F4) | F1, F2, F4 | F2, F4 | F1, F4 | F4 | F2, F1 | F2 | F1 | X | F1 | F2 | F1, F2 | F4 | F1, F4 | F2, F4 | F1, F2, F4 |
| Trimming Steps | | +1 | +2 | +3 | +4 | +5 | +6 | +7 | +8 | −1 | −2 | −3 | −4 | −5 | −6 | −7 |

Consequently, The position of the output terminal OUT of the binary bidirectional trimming circuit can also be further modified so that the (positive trimming steps, negative trimming steps) may be one of the following combinations (+2, −13), (3, −12), (4, −1), (5, −10), (+13, −2), (12, −2), (11, −4), (10, −5), (7, −8), and (6, −9).

The benefit of the present invention:
(1) the trimming step is bidirectional.
(2) The testing time can be save significantly.
(3) The possible chip's damaging due to fuse burning is decreased.

While the present invention has been particularly shown and described with reference to a preferred embodiment, it will be understood by those skilled in the art that various changes in form and detail may be without departing from the spirit and scope of the present invention. For example, four resistor sets used in the preferred embodiments are only illustration convenience, the sprit of the present invention can be further extended to N resistor sets. Furthermore, in the embodiment, one basic trimming step is composed of four resistors ($2^2$) connected in parallel. It can also be modified, For instance, one trimming step for binary bidirectional trimming circuit can be composed of $2^m$ resistors connected in parallel. In case of m=3, the resistor sets may be composed of (1) 8 resistors with a first fuse connected in parallel; (2) 4 resistors with a second fuse connected in parallel; (3) 2 resistors with a third fuse connected in parallel; (4) 1 resistor with a fourth fuse connected in parallel; (5) 2 resistor in series connected and with two ends thereof connected in parallel with a fifth fuse so as to provide 1, 2, 4, 8, and 16 trimming steps, respectively.

What is claimed is:

1. A binary bidirectional trimming circuit, comprising:
a first resistor set having 4 resistors in parallel connected and a first fuse bridged two ends thereto provide one trimming step;
a second resistor set having 2 resistors in series connected and a second fuse bridged two ends thereto provide eight trimming steps;
a third resistor set having 2 resistors in parallel connected and a third fuse bridged two ends thereto provide two trimming steps;
a fourth resistor set having 1 resistor and a fourth fuse bridged two ends thereto provide four trimming steps;
a first loading resistor;
a second loading resistor; and
wherein all of said resistors have the same resistance except both of said loading resistors, and still said first loading resistor, and said second resistor set are in series connected to constitute a first set and said second loading resistor, said first resistor set, said third resistor set, said fourth resistor set are in series connected in any predetermined order to constitute a second set having at most seven trimming steps, furthermore, a connection node between said first set and said second set, which are in series connected, is chosen as an output terminal.

2. A binary bidirectional trimming circuit, comprising:
a first resistor set having 4 resistors in parallel connected and a first fuse bridged two ends thereto provide one trimming step;
a second resistor set having 2 resistors in series connected and a second fuse bridged two ends thereto provide eight trimming steps;
a third resistor set having 2 resistors in parallel connected and a third fuse bridged two ends thereto provide two trimming steps;
a fourth resistor set having 1 resistor and a fourth fuse bridged two ends thereto provide four trimming steps;
a first loading resistor;
a second loading resistor; and
wherein all of said resistors have the same resistance except said loading resistors, and still said first loading resistor, said first resistor set, said second resistor set are in series connected in any predetermined order to constitute a first set having at most nine trimming steps, and said second loading resistor, said third resistor set, and said fourth resistor set are in series connected in any predetermined order to constitute a second set, furthermore, a connection node between said first set and said second set, which are in series connected, is chosen as an output terminal.

* * * * *